(12) United States Patent
Yang et al.

(10) Patent No.: US 7,417,860 B2
(45) Date of Patent: Aug. 26, 2008

(54) HEAT DISSIPATION DEVICE

(75) Inventors: Bo-Yong Yang, Shenzhen (CN); Zhi-Yong Zhou, Shenzhen (CN); Cheng-Tien Lai, Taipei Hsien (TW)

(73) Assignees: Fu Zhun Precision Industry (Shen Zhen) Co., Ltd., Shenzhen, Guangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 0 days.

(21) Appl. No.: 11/621,083

(22) Filed: Jan. 8, 2007

(65) Prior Publication Data

US 2008/0165503 A1 Jul. 10, 2008

(51) Int. Cl.
*H05K 7/20* (2006.01)
*F28D 15/00* (2006.01)

(52) U.S. Cl. .............. 361/710; 361/704; 361/709; 361/719; 165/104.33; 165/185; 174/16.3

(58) Field of Classification Search ............ 361/704, 361/709–710, 719; 165/80.3, 104.33, 185; 174/16.3
See application file for complete search history.

(56) References Cited

U.S. PATENT DOCUMENTS

| | | | |
|---|---|---|---|
| 5,224,538 A * | 7/1993 | Jacoby .............. 165/166 |
| 5,331,507 A * | 7/1994 | Kyung et al. .......... 361/720 |
| 5,386,338 A | 1/1995 | Jordan et al. |
| 5,428,897 A | 7/1995 | Jordan et al. |
| 5,570,271 A | 10/1996 | Lavochkin |
| 6,392,886 B1 | 5/2002 | Lee et al. |
| 6,496,371 B2 | 12/2002 | Winkel et al. |
| 6,518,507 B1 | 2/2003 | Chen |
| 6,734,371 B2 * | 5/2004 | Arrigotti et al. .......... 174/260 |
| 6,947,283 B2 | 9/2005 | Hsieh et al. |
| 7,142,429 B2 * | 11/2006 | Hsieh et al. ........... 361/710 |
| 7,203,066 B2 * | 4/2007 | Lee et al. ............ 361/704 |
| 2007/0089869 A1 * | 4/2007 | Hwang et al. .......... 165/152 |
| 2007/0240868 A1 * | 10/2007 | Wu et al. ............. 165/185 |

FOREIGN PATENT DOCUMENTS

JP 2002050723 A * 2/2002

* cited by examiner

*Primary Examiner*—Jayprakash N Gandhi
*Assistant Examiner*—Robert J Hoffberg
(74) *Attorney, Agent, or Firm*—Frank R. Niranjan

(57) ABSTRACT

A heat sink assembly (10) includes a heat sink (12) and a wire clip (14). The heat sink includes a base (120) and a plurality of fins (124) mounted on the base. A channel (126) is defined between two neighboring ones of the fins. A pair of points (1250) are punched on one of the fins and received in the channel. The wire clip includes a main body (140), first and second legs (141, 142) extending from opposite ends of the main body. The wire clip intervenes across the points and extends through the channel such that the main body is received in the channel and the first and second legs are located at opposite ends of the channel. Thus, the wire clip is prevented from dropping from the channel in a direction parallel to the channel.

14 Claims, 4 Drawing Sheets

HEAT DISSIPATION DEVICE

BACKGROUND OF THE INVENTION

1. Field of the Invention

The present invention relates to a heat dissipation device, and more particularly to a heat dissipation device having a heat sink and a wire clip, wherein the wire clip can be easily and reliably pre-assembled to the heat sink before the heat dissipation device is used to cool a CPU mounted on a printed circuit board.

2. Description of Related Art

Advances in microelectronics technology have resulted in electronic devices which process signals and data at unprecedented high speeds. During operation of many contemporary electronic devices such as CPUs, large amounts of heat are produced. The heat must be efficiently removed, to prevent the system from becoming unstable or being damaged.

Typically, a heat sink assembly comprises a heat sink, a fan and a clip attached to an outer surface of the electronic device to facilitate removal of heat therefrom. The clip in this kind of assembly is a discrete part which must be packed and transported separately. The clip takes up additional transportation space. Furthermore, in use, the clip is prone to be displaced or to fall away from the heat sink. Thus the clip does not always firmly attach the heat sink to the electronic device, thereby lowering the efficiency of heat removal.

To overcome the above-mentioned problems, a spring metal clamp is commonly used to fasten the clip to the heat sink prior to transportation. This kind of spring metal clamp is not easily made, and requires a special apparatus to complete assembly. Thus the manufacturing and assembly processes are unduly complicated and costly.

An improved heat sink assembly, which overcomes the above problems, is desired.

SUMMARY OF THE INVENTION

A heat sink assembly in accordance with a preferred embodiment of the present invention, includes a heat sink and a wire clip. The heat sink includes a base and a plurality of fins mounted on the base. A channel is defined between the fins. A pair of points are punched on one of the fins and received in the channel. The wire clip includes a main body, first and second legs extending from opposite ends of the main body. The wire clip intervenes across the points and extends through the channel in such a manner that the main body is received in the channel and the first and second legs are located at opposite ends of the channel. Thus, the wire clip is prevented from being drop from the channel in a direction parallel to the channel.

Other advantages and novel features will become more apparent from the following detailed description of preferred embodiments when taken in conjunction with the accompanying drawings, in which:

BRIEF DESCRIPTION OF THE DRAWINGS

Many aspects of the present device can be better understood with reference to the following drawings. The components in the drawings are not necessarily drawn to scale, the emphasis instead being placed upon clearly illustrating the principles of the present device. Moreover, in the drawings, like reference numerals designate corresponding parts throughout the several views.

DETAILED DESCRIPTION OF THE INVENTION

Figure 1:
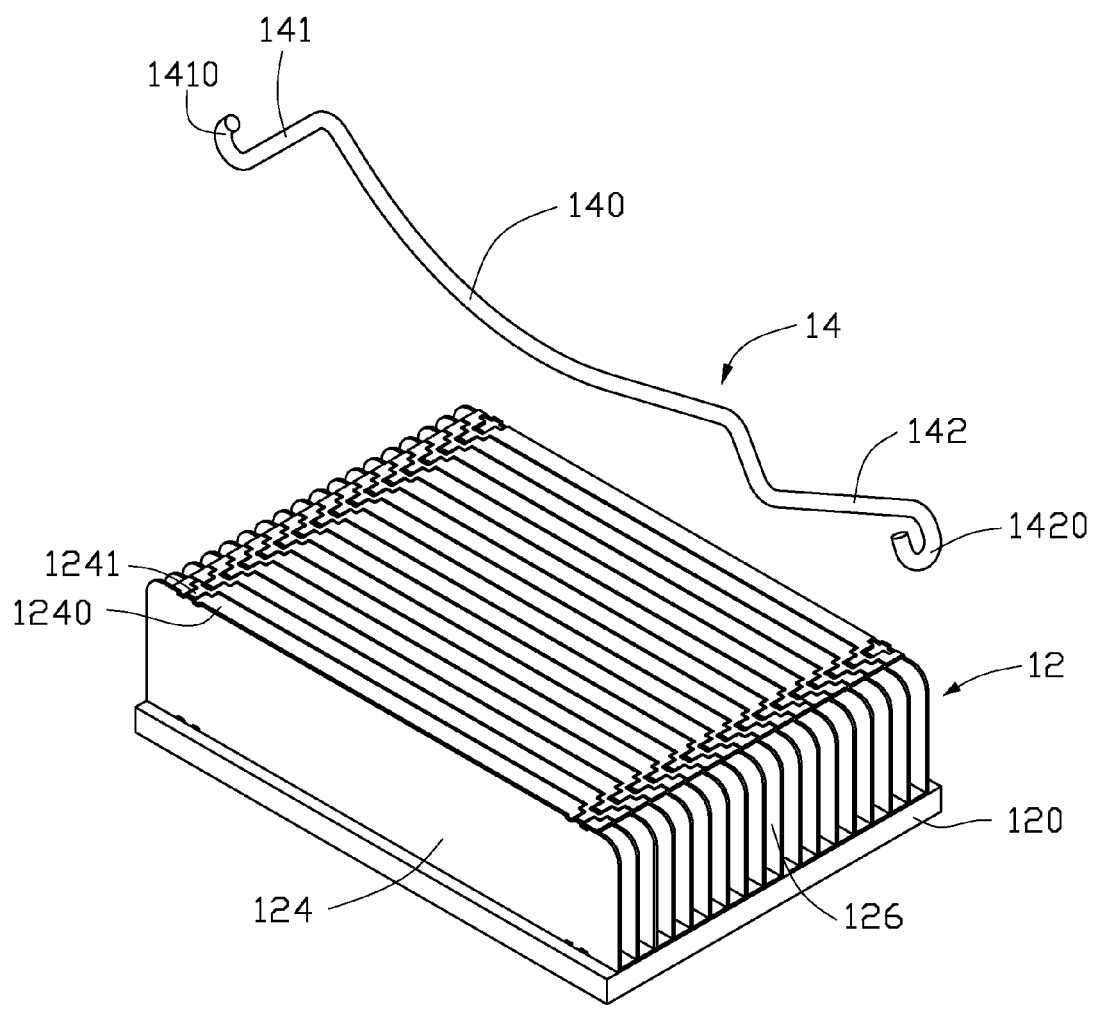
FIG. 1 is an exploded, isometric view of a heat sink assembly in accordance with a preferred embodiment of the present invention.
Figure 2:
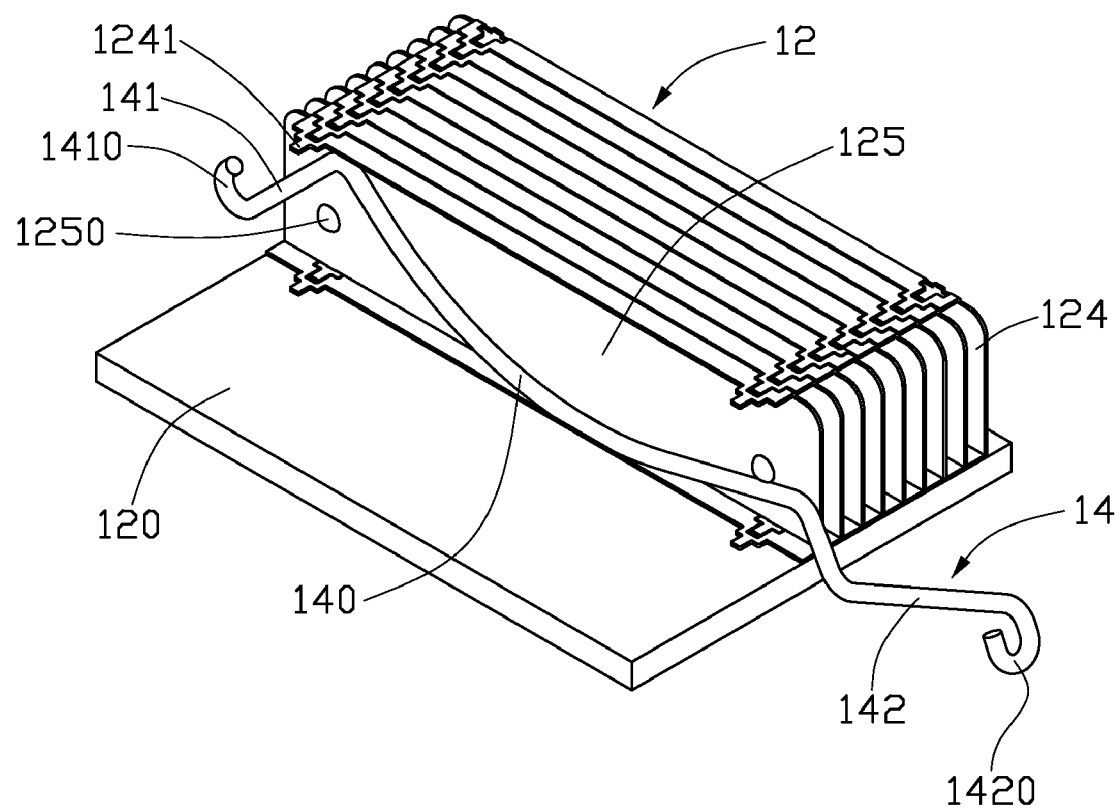
FIG. 2 is an assembled view of FIG. 1, wherein fins of the heat sink assembly are partly removed.

FIGS. 1-2 shows a heat sink assembly 10 in accordance with a preferred embodiment of the present invention. The heat sink assembly 10 comprises a heat sink 12 and a wire clip 14.

The heat sink 12 has a base 120, and a plurality of fins 124 extending upwardly from the base 120. The fins 124 are spaced from each other such that channels 126 are evenly defined between the fins 124. Each of the fins 124 forms a pair of flanges 1240 at upper and lower edges thereof. Each flange 1240 defines a hole (not labeled) therein. A bulge 1241 extends from an end of the flange 1240. The bulges 1241 of the fins 124 are engaged in the holes of adjacent fins 124. The fins 124 are clasped each other at top and bottom thereof in a manner such that the wire clip 14 is prevented from dropping from the top of the channel 126. The fins 124 have a fin 125 located at a center thereof. A pair of points 1250 are substantially symmetrically punched on the fin 125 and located adjacent to two lateral sides of the fin 125, respectively.

The wire clip 14 is made from a single piece of spring wire. The wire clip 14 has a wire diameter similar to a perpendicular distance between adjacent fins 124, 125. In this preferred embodiment of the present invention, the fin 124 adjacent to the fin 125 faces towards the points 1250 of the fin 125. The wire diameter of the wire clip 14 is larger than a perpendicular distance between each point 1250 to the fin 124 adjacent to the fin 125 such that there is an interference between the wire clip 14 and the fins 124, 125 when the wire clip 14 is pushed through the points 1250 in the channel 126 between the fins 124, 125. The wire clip 14 comprises an arced and elongated main body 140 for extending through the heat sink 12 in the channel 126 between the adjacent fins 124, 125. The main body 140 is formed between first and second legs 141, 142 extending from opposite ends of the main body 140. The main body 140 has a pressing portion (not labeled) located at a bottom thereof, which is for contacting with the lower flange 1240 of the fin 125 for pressing downwardly against the base 120 of the heat sink 12. The main body 140 has two arms (not labeled) extending slantwise upwardly relative to the pressing portion thereof such that the main body 140 forms a substantially V-shaped configuration. A perpendicular distance between free ends of the two arms is substantially equal to a length of the channel 126. The first leg 141 extends downwardly from an end of the main body 140. The second leg 142 is bent downwardly from the other end of the main body 140 and then extends upwardly. Hooked feet 1410, 1420 are formed at free ends of the first and second legs 141, 142.

Referring to FIG. 2, in assembly, the wire clip 14 intervenes across the points 1250 and extends through the channel 126 between the fin 125 and the fin 124 adjacent to the fin 125 in a manner such that the main body 140 of the wire clip 14 is received in the channel 126 and the first and second legs 141, 142 are located at opposite ends of the channel 126. The free end of the arm of the main body 140 near the first leg 141 is located above the left one of the points 1250, while the free end of the arm of the main body 140 near the second leg 142 is located below the right one of the points 1250, as viewed from FIG. 2. In the preferred embodiment of the present invention, the first leg 141 of the wire clip 14 firstly slides across over the points 1250 from one lateral side of the channel 126 and is positioned at another opposite lateral side of the channel 126 after it overcomes the interference between the first leg 141 and the points 1250. The first leg 141 and the second leg 142 are located at opposite lateral sides of the heat sink 12 after the assembly of the heat sink assembly 10. Thus, the wire clip 14 cannot be easily drop from the heat sink 12 in a direction parallel to the channel 126 after the main body 140 of the wire clip 14 is received in the channel 126 between the fins 124, 125. The free end of the arm of the main body 140 near the first leg 141 resiliently abuts against a bottom surface the upper flange 1240. The pressing portion of the main body 140 resiliently abuts against the lower flange 1240. The arm of the main body 140 near the second leg 142 abuts upwardly against the right one of the points 1250. Thus, the wire clip 14 can be reliably secured to the heat sink 12 in the channel 126 between the fin 125 and the adjacent fin 124.

Figure 3:
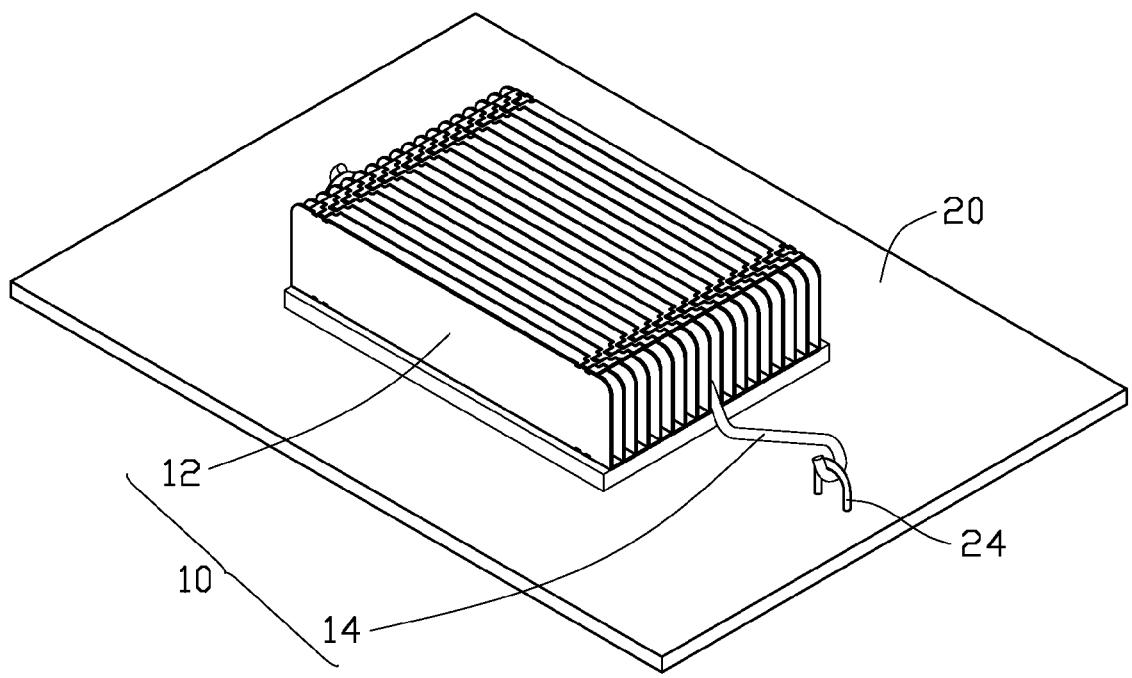
FIG. 3 is a perspective view of the heat sink assembly of FIG. 1 mounted on a printed circuit board.
Figure 4:
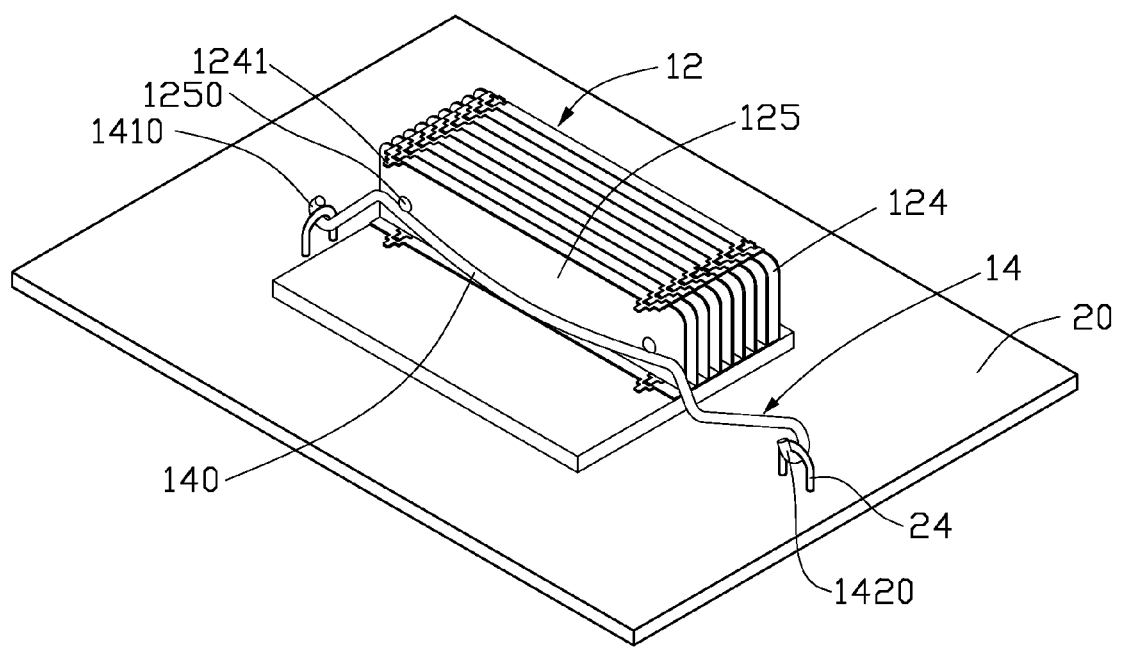
FIG. 4 is a view similar to FIG. 4, but the fins of the heat sink assembly are partly removed.

Referring to FIGS. 3-4, in operation, the heat sink assembly 10 is mounted on a CPU (not shown). The CPU is mounted on a printed circuit board (PCB) 20. A pair of clasps 24 are symmetrically formed on lateral sides of the CPU. The hooked foot 1420 of the wire clip 14 is firstly buckled with the right one of the clasps 24. The first leg 141 is then urged to move downwardly until the hooked foot 1410 is buckled with the left one of the clasps 24 such that the pressing portion of the main body 140 resiliently abuts against the base 120 of the heat sink 12 with increased force to press downwardly the heat sink 12 toward the CPU, whereby the heat sink 12 intimately contacts with the CPU. During the downward movement of the first leg 141, the arm of the main body 140 near the first leg 141 is urged to move downwardly and run over the left one of the points 1250 of the fin 125. When the hooked feet 1410, 1420 are both buckled with the clasps 24, the main body 140 is sandwiched between the points 1250 and the lower flange 1240 of the heat sink 12. The wire clip 14 and the heat sink 12 have sufficient engagement therebetween, to thereby prevent the heat sink 12 from sliding relative to the wire clip 14 along the channel 126 when the heat sink assembly 10 is vibrated.

In the present invention, the points 1250 are punched on the fin 125, which not only has relatively lower cost but also can prevent the wire clip 14 from sliding off the channel 126 before the heat sink assembly 10 is mounted to the printed circuit board 20 to cool the CPU. Furthermore, after the heat sink assembly 10 is mounted to the printed circuit board 20, the points 1250 downwardly abut against the wire clip 14, whereby the heat sink 12 and the wire clip 14 can have a strong connection therebetween to effectively prevent a sliding of the heat sink 12 relative to the wire clip 14 along the extension direction of the wire clip 14 when the heat sink 12 is subjected to vibration.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A heat sink assembly for dissipating heat comprising:
    a heat sink having a base and a plurality of fins extending from the base, a pair of points being punched on one of the fins, a channel being defined between adjacent two fins, the points being received in the channel; and
    a wire clip positioned on the heat sink, the wire clip comprising a main body;
    wherein the main body of the wire clip intervenes across the points, downwardly presses the heat sink, engages upwardly against the points, and extends through the channel such that the main body is received in the channel to prevent the clip from sliding off from the channel in a direction parallel to the channel;
    wherein the main body of the wire clip is arced and elongated and has a substantially V-shaped configuration; and wherein a perpendicular distance between each point and an adjacent fin is smaller than a wire diameter of the clip.

2. The heat sink assembly as claimed in claim 1, wherein the two points are symmetrically located adjacent to opposite lateral sides of the one of the fins.

3. The heat sink assembly as claimed in claim 1, wherein the wire clip further comprises first and second legs extending from opposite ends of the main body and located at opposite lateral sides of the channel.

4. The heat sink assembly as claimed in claim 3, wherein the first leg extends downwardly from an end of the main body and the second leg is bent downwardly from the other end of the main body and then extends upwardly.

5. The heat sink assembly as claimed in claim 3, wherein hooked feet are formed at free ends of the first and second legs.

6. The heat sink assembly as claimed in claim 1, wherein the main body has a pressing portion located at a bottom thereof for pressing the base of the heat sink, and two arms slantwise and upwardly relative to the pressing portion.

7. The heat sink assembly as claimed in claim 6, wherein the two arms engage upwardly with the points, respectively.

8. The heat sink assembly as claimed in claim 1, wherein flanges are bent from upper and lower edges of the fins for preventing the clip from dropping from a top of the channel.

9. An electronic device assembly comprising:
    a printed circuit board having a pair of clasps formed thereon;
    a heat sink having a base and fins extending from the base, a receiving channel being defined between the fins, a pair of points punched from one of the fins at one of opposite sides of the receiving channel and toward the receiving channel;
    a wire clip comprising:
    a main body comprising a pressing portion and two arms extending slantwise upwardly relative to the pressing portion; and
    a pair of legs extending away from two free ends of the arms of the main body and located at opposite lateral sides of the receiving channel of the heat sink, respectively, each leg having a hooked foot at a distal end thereof buckled with a corresponding clasp of the printed circuit board;
    wherein the points abut downwardly against the arms of the main body of the clip when the hooked feet of the clip are buckled with the clasps of the printed circuit board to prevent the heat sink from sliding relative to the clip along the receiving channel; and
    wherein flanges are bent from upper and lower edges of the fins for preventing the clip from dropping from a top of the receiving channel.

10. The electronic device assembly as claimed in claim 9, wherein a perpendicular distance between each point and an adjacent fin is smaller than a wire diameter of the wire clip for preventing the clip from being sliding off from the receiving channel in a direction parallel to the receiving channel.

11. The electronic device assembly as claimed in claim 9, wherein the pressing portion of the main body downwardly presses the heat sink.

12. A heat sink assembly comprising:
a heat sink comprising a base and a plurality) of fins extending upwardly from the base, wherein one of the fins is formed with a pair of points protruding into a channel between the one of the fins and an adjacent fin;
a wire clip received in the channel, having a substantially V-shaped main body with two arms at two end portions thereof, respectively, first and second legs extending outwardly from free ends of the arms, respectively, wherein the free end of one of the arms near the first leg is located above one of the points near the first leg and the other one of the arms near the second leg abuts upwardly against the other one of the points.

13. The heat sink assembly as claimed in claim 12, wherein the main body has a central pressing portion resiliently abutting downwardly against the a lower flange of the one of the fins.

14. The heat sink assembly as claimed in claim 13, wherein two hooked feet extending outwardly respectively from the first and second legs, adapted for connecting with a printed circuit board, to thereby secure the heat sink on the printed circuit board.

* * * * *